United States Patent
Wilhelmsson et al.

(10) Patent No.: US 6,606,726 B1
(45) Date of Patent: Aug. 12, 2003

(54) OPTIMIZATION OF ACCEPTANCE OF ERRONEOUS CODEWORDS AND THROUGHPUT

(75) Inventors: Leif Wilhelmsson, Dalby (SE); Robert Hed, Lund (SE); Hante Meuleman, Lund (SE)

(73) Assignee: Telefonaktiebolaget L M Ericsson (publ), Stockholm (SE)

( * ) Notice: Subject to any disclaimer, the term of this patent is extended or adjusted under 35 U.S.C. 154(b) by 386 days.

(21) Appl. No.: 09/654,779

(22) Filed: Sep. 5, 2000

Related U.S. Application Data (60) Provisional application No. 60/211,272, filed on Jun. 13, 2000.

(51) Int. Cl.⁷ ............................................. H03M 13/00
(52) U.S. Cl. ................................................. 714/758
(58) Field of Search ................................. 714/755, 746, 714/758, 751, 752

(56) References Cited

U.S. PATENT DOCUMENTS

| | | | |
|---|---|---|---|
| 5,031,179 A | 7/1991 | Yoshida et al. ............. | 714/748 |
| 5,255,343 A | 10/1993 | Su ............................. | 702/242 |
| 5,271,011 A | 12/1993 | McMullan, Jr. et al. .... | 714/807 |
| 5,392,300 A | 2/1995 | Borth et al. | |
| 5,497,383 A | 3/1996 | Thome et al. .............. | 714/795 |
| 5,517,511 A | 5/1996 | Hardwick et al. .......... | 714/755 |
| 5,530,708 A * | 6/1996 | Miya .......................... | 714/786 |
| 5,570,377 A | 10/1996 | Merino Gonzalez et al. | |
| 5,577,053 A * | 11/1996 | Dent .......................... | 714/755 |
| 5,734,826 A | 3/1998 | Olnowich et al. .......... | 709/238 |
| 5,867,510 A * | 2/1999 | Steele ........................ | 714/758 |
| 5,870,405 A | 2/1999 | Hardwick et al. .......... | 714/701 |
| 6,012,160 A | 1/2000 | Dent .......................... | 714/786 |
| 6,170,073 B1 * | 1/2001 | Jarvinen et al. ............ | 714/758 |

FOREIGN PATENT DOCUMENTS

| | | |
|---|---|---|
| EP | 0 570 648 A1 | 5/1992 |
| EP | 0822681 A2 | 2/1998 |

OTHER PUBLICATIONS

J.C. Haartsen, "The Bluetooth Radio System," *IEEE Personal Communications*, vol. 7, No. 1, Feb. 2000, pp. 28–36.

\* cited by examiner

*Primary Examiner*—Albert Decady
*Assistant Examiner*—Shelly A Chase
(74) *Attorney, Agent, or Firm*—Burns, Doane, Swecker & Mathis, LLP (57) ABSTRACT

An encoded signal that comprises a plurality of received encoded signal values is received by using an error correction decoding technique to generate a plurality of decoded signals from the encoded signal, wherein the plurality of decoded signals includes one or more decoded information signals and one or more decoded error detection signals. A correction value is generated that is representative of how much correction was performed by the error correction decoding technique to generate the plurality of decoded signals. The one or more decoded error detection signals are used to generate an error detection result. The decoded information signals are then alternatively accepted or rejected as a function of the error detection result and a comparison of the correction value with a threshold value.

16 Claims, 5 Drawing Sheets

OPTIMIZATION OF ACCEPTANCE OF ERRONEOUS CODEWORDS AND THROUGHPUT

CROSS REFERENCE TO RELATED APPLICATION

This application claims the benefit of U.S. Provisional Application No. 60/211,272 filed Jun. 13, 2000.

BACKGROUND

The present invention relates to digital communication where the information is transmitted in coded blocks and where coding is used both for error correction and error detection. More particularly, the invention relates to simple ways to reduce the error correcting capability in systems that have already been designed in order to improve on error detecting capability.

In wireless communications, the data to be communicated is typically transmitted in bursts. This is for instance the case for cellular systems like GSM and IS-95, and it is also the case for ad hoc systems, such as BLUETOOTH™, operating in the unlicenced Industrial Scientific and Medical (ISM) band at 2.45 GHz.

For all of these kind of systems, coding is used to enhance the quality of the link. One can distinguish between two different kinds of coding: coding used for error correction and coding used for error detection. Often, both of these types of coding are employed to optimize the performance. The working procedure for the encoder and the decoder when both error correction and error detection are used is as follows. First, k information bits to be sent are encoded for error detection. This step is typically achieved by adding so-called cyclic redundancy check (CRC) bits. The total number of bits can then be represented by k', where k'–k CRC bits have been added. The k' bits are then encoded for error correction such that the total number of transmitted bits equals n. This might be done either by encoding the k' bits into one single codeword consisting of n bits, or it might be done by first dividing the k' bits into $n_s$ segments, and then encoding each one of these into codewords of length $n/n_s$. In this way the rate of the complete coding scheme equals k/n. It can be seen that the parameter k' is a design parameter which determines how much of the overall coding is spent on error correction and error detection, respectively. For example, in a BLUETOOTH™-compliant system, a 10-bit header (k=10) is first encoded for error detection by adding 8 CRC bits, so that k'=18. The code used for error detection ensures that the distance between any 18 bit codewords is at least 4 (i.e., at least 4 errors would have to occur before an incorrect header would go undetected). The 18 bits are then encoded for error correction by a (3,1) repetition code. For channel conditions in which the probability of a bit error on the channel, $P_b$, is on the order of 0.1% (which is a reasonable level for the system to operate in), the probability of incorrectly decoding a packet header becomes very small, and the probability of accepting an erroneous header negligible.

The three repetition-coded bits (corresponding to the same original unencoded bit) together constitute a symbol. A majority decision is used when decoding the symbol, which means that so long as at least two of the three bits are correct, a correct decoding decision can be made. In the following, references to bit errors are intended to refer to errors in individual ones of the three repetition-coded bits.

The operation of the receiver is typically as follows. First error correction is performed in the decoding process. Then, the outcome of the error correction is checked by means of the error detection strategy. In the ideal case, the error correction code makes it possible to correct most of the errors in the received n bit blocks, and in this case the number of retransmissions is reduced significantly. Before the decoded codeword is accepted as correct, it is checked by the outer decoder used for error detection only. In this way, the probability of accepting an erroneous decoded codeword can ideally be made sufficiently small.

In cellular systems, the effect of interference from other users is controlled by means of cell- and frequency-planning, as well as by strict power-control. This enables one to ensure that the system will operate at or near optimal channel conditions, which in turn keeps the number of errors within reasonable values. This effectively means that although an erroneous codeword may sometimes be received, it only contains a small number of errors, so that there is a very high probability that this erroneous codeword will be detected by the code for error detection. Consequently, the probability of having an undetected error can be kept sufficiently small.

The same is not true for ad-hoc networks, such as BLUETOOTH™ Although power control might be implemented in order to counteract the propagation loss, the interference is not under control in such systems. In fact, since it is quite possible for an interfering device to be much closer to the receiver than the intended transmitter is, the signal-to-interference ratio (SIR) can be extremely small (e.g., on the order of –20 dB). Also, for a system operating in an unlicenced band such as the 2.45 GHz band, the interferer need not be another communication device, but can also be a device with a significantly higher output power, such as a microwave oven. Again this can cause the received SIR to be more than 20 dB below the point at which the system is working properly.

Due to the possible presence of a very strong interferer in ad hoc networks, some type of spread spectrum technique is typically employed. There are essentially two ways that a spread spectrum system can mitigate interference: by interference suppression or by interference avoidance. Direct Sequence Spread Spectrum (DSSS) is an example of an interference suppression technique. Here the instantaneously used bandwidth greatly exceeds the information data rate to be communicated. The processing gain (PG) is obtained through the spreading sequence. For a multiple access system based on DSSS to work properly, it is essential that the interfering signal not be too much stronger than the desired one. This is due to the fact that the amount of suppression that it is possible to achieve is limited by the PG. This is described in J. C. Haartsen, "The Bluetooth Radio System," *IEEE Personal Communications*, vol. 7, No. 1, February 2000.

A multiple access technique that is based on interference avoidance is frequency hopped spread spectrum (FHSS). Unlike the case with DSSS, in FHSS the instantaneous bandwidth is on the same order as the symbol rate. The PG in FHSS is instead obtained by letting the carrier frequency hop over a total bandwidth that greatly exceeds the instantaneous one. Ideally, by making the carrier frequencies orthogonal to each other, a problem occurs only if the same carrier frequency is being used by more than one user at a particular moment in time. In practice, a problem might also occur if the users are transmitting on adjacent carrier frequencies at the same time, although the problem of two users transmitting on the same frequency (so-called co-channel interference) typically is the dominating source of performance degradation. If the different devices are hopping between the different carrier frequencies independent of one another in a pseudo-random fashion, the devices will use different carrier frequencies most of the time and will therefore avoid interfering with one another. A major advantage with the FHSS technique compared to DSSS is that the avoidance principle works even if the devices are transmitting with very different output powers. If the data is transmitted in packets, which typically is the case, this means that only a small fraction of the received packets will contain errors, and the throughput of the system will therefore be very good. For the small fraction of packets that are hit by the presence of an interferer, the large number of bit errors in the received packet makes the error correcting code virtually worthless. For example, the probability of a bit error, $P_b$, might very well be on the order of 20–50%. This of course means that the packet will not be correctly decoded, but what is even worse is that unless the code used for error detection is powerful enough, it might not even be detected that the received packet contains errors. Without such detection, there is no possibility to correct the situation by means of packet retransmission.

The simple explanation for this malfunction is that for relatively good channel conditions the probability of falsely accepting a packet is very small due to the combined use of an error correcting code and an error detecting code. However, if the channel conditions become very poor, the probability of falsely accepting a packet will be determined by the properties of the error detecting code only. Considering the above-mentioned BLUETOOTH™ example, the probability of having an undetected error for the header may be estimated as the number of codewords divided by the total number of possible received 18 bit words, which equals:

$$P_{\odot c} = \frac{2^{n_e}}{2^{n_i}} = 2^{-1} = 0.4\%. \quad (1)$$

If one supposes that 1% of the packets are hit by a strong interferer in such a way that the access code is still found but the header is more or less ruined, then the probability of failing to detect that a header is erroneous is about $4 \cdot 10^{-5}$. Given a packet rate of approximately 1600 packets per second on a link, there will be one falsely accepted packet header every 15 minutes. Whether this is acceptable or not depends on the consequences, which is application specific. If a falsely accepted header is not much worse than an erroneous header, then this is certainly no problem. If, however, one expects more serious problems, then this high a probability of accepting an incorrect header is unlikely to be acceptable. Unfortunately, empirical evidence indicates that the consequences of accepting an incorrect header are not as harmless as not decoding correctly.

When a system is initially designed, it can be hard to determine how much of the coding should be devoted to error correction and how much to error detection. Furthermore, after a system has been in operation for a while, it is possible for the usage to completely change over time. In either of these cases, it is desirable to be able to "fine-tune" how the trade-off between error correction and error detection should be done in order to give optimum performance.

It is therefore desirable to provide a mechanism that allows for the above-mentioned fine-tuning in an already designed system. It is also desirable to provide a system in which the same constituting codes can be used under very different channel conditions by simply adapting to the actual channel conditions.

SUMMARY

It should be emphasized that the terms "comprises" and "comprising", when used in this specification, are taken to specify the presence of stated features, integers, steps or components; but the use of these terms does not preclude the presence or addition of one or more other features, integers, steps, components or groups thereof.

In accordance with one aspect of the present invention, the foregoing and other objects are achieved in methods and apparatuses for receiving an encoded signal that comprises a plurality of received encoded signal values. In one aspect of the invention, this is done by using an error correction decoding technique to generate a plurality of decoded signals from the encoded signal, wherein the plurality of decoded signals includes one or more decoded information signals and one or more decoded error detection signals. A correction value is generated that is representative of how much correction was performed by the error correction decoding technique to generate the plurality of decoded signals. The one or more decoded error detection signals are used to generate an error detection result. The decoded information signals are then alternatively accepted or rejected as a function of the error detection result and a comparison of the correction value with a threshold value.

In some embodiments, the received encoded signal values may be binary values, and the correction value may be a Hamming weight, $W_H$, that is generated as a function of the received encoded signal values and a corresponding plurality of comparison encoded signal values generated from the plurality of decoded signals.

In such embodiments, alternatively accepting or rejecting the decoded information signals as a function of the error detection result and the comparison of the correction value with a threshold value may comprise rejecting the decoded information signals if the error detection result indicates that the plurality of decoded signals includes an error or if the Hamming weight, $W_H$, is greater than the threshold value; and otherwise accepting the decoded information signals.

In some alternative embodiments, the received encoded signal values may be soft decision values. In such cases, the correction value may be an estimate of a noise energy in the received encoded signal values. In another aspect of the invention, the estimate of the noise energy may be a squared Euclidean distance $W_{Euc}$, that is generated as a function of the received encoded signal values and a corresponding plurality of comparison encoded signal values generated from the plurality of decoded signals.

In another aspect of the invention, the one or more decoded error detection signals comprise one or more cyclic redundancy check bits.

In yet another aspect of the invention, when the received encoded signal values are binary values, the correction value may be a value, $M_{HEC}$, that represents how many of the plurality of decoded signals were generated without any correction being performed by the error correction decoding technique.

In still another aspect of the invention, alternatively accepting or rejecting the decoded information signals as a function of the error detection result and the comparison of the correction value with a threshold value may comprise rejecting the decoded information signals if the error detection result indicates that the plurality of decoded signals includes an error or if the correction value, $M_{HEC}$, is less than the threshold value; and otherwise accepting the decoded information signals.

BRIEF DESCRIPTION OF THE DRAWINGS

The objects and advantages of the invention will be understood by reading the following detailed description in conjunction with the drawings in which.

DETAILED DESCRIPTION

The various features of the invention will now be described with respect to the figures, in which like parts are identified with the same reference characters.

To facilitate an understanding of the invention, many aspects of the invention are described in terms of sequences of actions to be performed by, for example, elements of a computer system. It will be recognized that in each of the embodiments, the various actions could be performed by specialized circuits (e.g., discrete logic gates interconnected to perform a specialized function), by program instructions being executed by one or more processors, or by a combination of both. Moreover, the invention can additionally be considered to be embodied entirely within any form of computer readable storage medium having stored therein an appropriate set of computer instructions that would cause a processor to carry out the techniques described herein. Thus, the various aspects of the invention may be embodied in many different forms, and all such forms are contemplated to be within the scope of the invention. For each of the various aspects of the invention, any such form of embodiment may be referred to herein as "logic configured to" perform a described action, or alternatively as "logic that" performs a described action.

The invention provides a mechanism that makes it possible to, in a simple way, trade throughput in exchange for a decreased probability of accepting erroneous codewords. The technique takes advantage of the fact that error correction and error detection can be used in combination to give good performance. Without changing the codes used either for error correction or error detection, the invention makes it possible to trade the error correcting capability for a significant gain in error detection performance.

In particular, the techniques are applicable when it is desirable to permit exactly the same codes for error correction and error detection to be used in very different environments. With the proposed techniques, the overall code can easily be adjusted to give a sufficiently low probability of accepting an incorrect codeword, while still giving as high throughput as possible.

To facilitate an understanding of the invention, a relatively simple example will be described first, Then, a more generalized description is presented.

Suppose that the data to be transmitted is encoded as follows. First, the k information bits are encoded for error detection. This is done by adding a number of error detection bits, such as CRC bits, so that the total number of bits now equals k'. Then, these k' bits are encoded for error correction, for example by a simple (3,1) repetition code, so that the length of a codeword equals 3k'. With the notation previously introduced, this means that $n_s$=k'. The codewords are transmitted over a noisy channel so that upon reception at the receiver side the probability that one of the code bits is in error equals $P_b$. The error correction decoding is then based on majority decision. Since each of the k' bits is repeated three times, this means that the decision is in favor of a one if at least two of the three bits constituting a symbol is a one, and in favor of a zero otherwise. Clearly, then, the probability of erroneously decoding a coded symbol $$P_s = P_b^3 + 3P_b^2(1-P_b). \tag{2}$$

For relatively good channel condition, that is, for relatively small values of $P_b$, it follows from Eq. (2) that Ps>>$P_b$, so that the error correcting code will improve the performance significantly.

After decoding the k' symbols, their CRC is checked to determine whether they constitute a valid codeword. If this is the case, this codeword is accepted as correct, and the k information bits are passed to the next higher layer. If the CRC code has a minimum distance of $d_{min}$, then at least $d_{min}$ of the symbols would have to be erroneous in order to fail to detect an incorrect codeword. If the channel is good, the probability of this event will be very small because Eq. (2) guarantees that $P_s$ will be very small. If the channel is very poor, on the other hand, then it can be seen from Eq. (2) that performance will not be very much improved. For the case in which $P_b$=50%, it follows that $P_s$=50%, so that no coding gain at all is obtained. In this latter case, the probability of accepting an erroneous header will therefore be completely determined by the properties of the CRC code, and in many cases the probability of accepting an erroneous packet will be too high, Referring to Eq. (2), one can deduce that most symbol errors have the property that only two of the three bits are in error, but not all three. This means that, typically, the erroneously decoded symbols have the property that they are not decoded the same, but rather one bit is erroneously altered. The reason for this is that the second term in the sum is the dominating one, since one can assume that $P_b \leq 50\%$. Now, to reduce the probability of accepting an erroneous codeword, it therefore makes sense to require not only that the CRC checks, but also that at most, a predetermined number of bits, herein denoted $FEC_C$, have been corrected by the forward error correcting (FEC) code. Choosing a small value for $FEC_C$ will result in the requirements for accepting a codeword being more difficult to satisfy. This effectively means that the error correcting capability of the FEC code has been traded for better error detection capability. If $FEC_C$ is chosen to be a large value, on the other hand, less of the error correcting capability is traded, and, consequently, less improvement in terms of error detection capability is achieved.

The drawback with choosing a value for $FEC_C$ that is too small is that codewords that have been correctly decoded, but where more than $FEC_C$ bits have been altered (i.e., corrected) in the process, will be rejected. This will reduce the throughput for the system.

The invention has so far been described in connection with the parameter $FEC_C$, which is the maximum permissible number of corrected bits in the received codeword. In alternative embodiments, a different parameter, herein denoted $M_{HEC}$, may be used instead of the parameter $FEC_C$.

The relation between these parameters is that $M_{HEC}$ is the number of symbols not requiring any correction whatsoever ("unanimously decoded symbols"), whereas $FEC_C$ is just the opposite: it represents the amount of correction that was required in the decoding process. Taking an example in which there are 18 repetition coded symbols, $M_{HEC}$ will have a value $M_{HEC} \in \{0, 1, \ldots, 18\}$, where a value of 18 means that all 18 of the symbols were unanimously decoded.

In this embodiment, to circumvent the problem of accepting incorrect headers, an approach is taken wherein a packet is not accepted unless both the CRC indicates no errors and $M_{HEC}$ exceeds a threshold value, herein denoted $HEC_T$. That is to say, in order to accept a packet header it does not suffice that the CRC checks, but in addition at least $HEC_T$ of the total number of symbols (e.g., 18) in the packet header must have been decoded unanimously. The price to be paid for this is a reduction in throughput, since headers which are correct can nonetheless be rejected as a result of too many of the 18 decoded bits not having been unanimously decoded. The value of $HEC_T$ is a design parameter that should be chosen such that the probability of accepting an incorrect packet is reduced as much as possible by just reducing the number of rejected headers marginally. Choosing a suitable value of $HEC_T$ will now be discussed.

The probability of accepting an incorrect packet header is easily determined since the distance spectrum for the CRC code used for the header is known. The weight spectrum, S, is given by S=[1,0,0,0,18,0,162,0,322,0,356,0,138,0,26,0,1,0,0]. That is, there is one codeword of weight 0, 18 codewords of weight 4, 162 codewords of weight 6, and so forth. Given that the raw error probability on the channel equals $P_b$, and assuming the bit-errors in the code symbols to be independent, it follows that the symbol error probability, $P_s$, is given by $$P_s = P_b^3 + 3P_b^2(1-P_b), \quad (3)$$

and the probability of accepting an incorrect header is easily obtained as $$P_{ud} = \sum_{j=1}^{18} S(j+1) P_s^j (1-P_s)^{(18-j)}. \quad (4)$$

Figure 1:
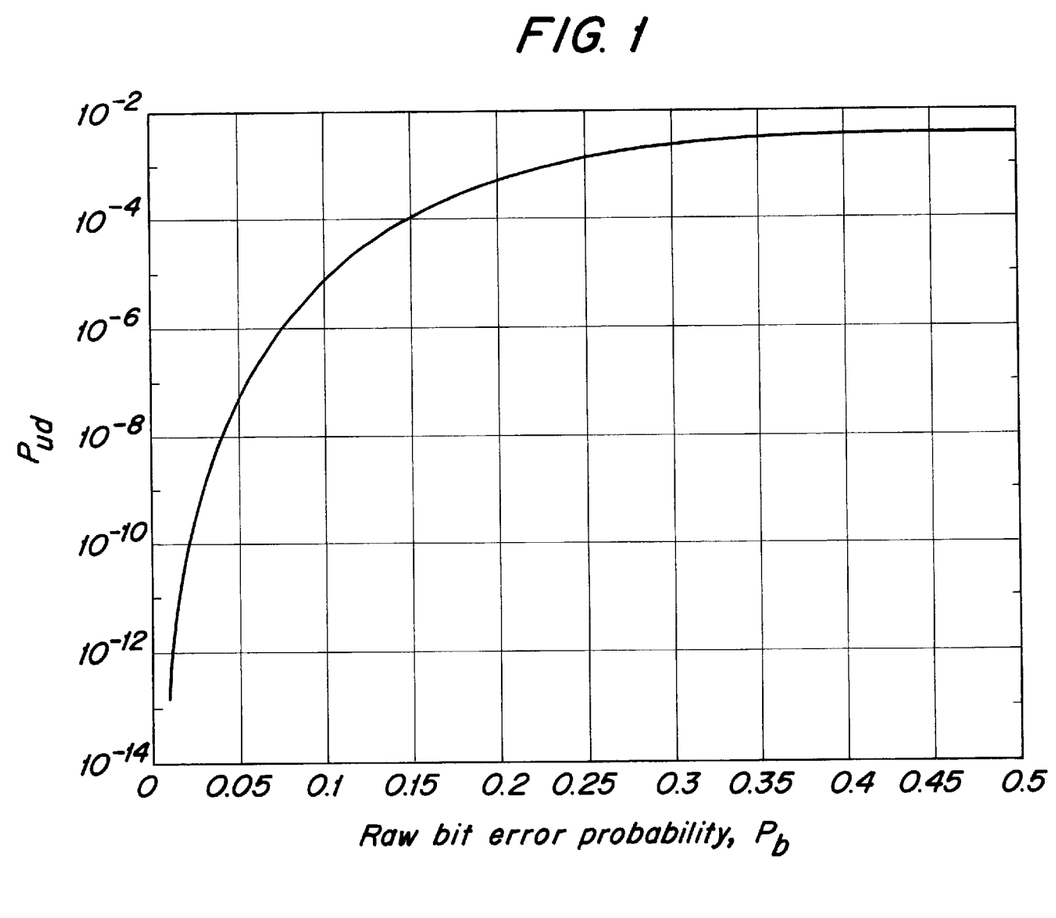
FIG. 1 is a graph depicting a plot of $P_{ud}$ as a function of $P_b$.

FIG. 1 is a graph depicting a plot of $P_{ud}$ as a function of $P_b$. As can be seen from this graph, as long as the channel is relatively good (the left most point on the curve corresponds to $P_b = 1\%$) the probability of accepting an incorrect packet header is sufficiently small. However, as $P_b$ exceeds, say, 20%, the situation is exceedingly worse. As expected, as $P_b$ approaches 50%, the probability of being able to correct an incorrect header approaches 0.4% (see Eq. (3))

This performance can be improved by adopting the principles of the invention. In order to choose a suitable value for the threshold $HEC_T$, its effect has to be found. First, let us define $p_1$ as the conditional probability of correcting one bit in a correctly decoded symbol. Then it follows that $$p_1 = \frac{3P_b(1-P_b)^2}{(1-p)^3 + 3P_b(1-P_b)^2} \quad (5)$$

Correspondingly, define $p_2$ as the conditional probability of "correcting" one bit in an erroneously decoded symbol (e.g., in a (3,1) repetition code, there are two bit errors and the actually correct bit is considered erroneous). This conditional probability equals $$p_2 = \frac{3P_b^2(1-P_b)}{3P_b^2(1-P_b) + P_b^3}. \quad (6)$$

Next, consider a decoded sequence of, for example, 18 bits. Suppose that $n_{se}$ symbols are in error, and, consequently $18-n_{se}$ symbols are correctly decoded. The probability that $M_{HEC} = 18 - n_{be}$ (i.e., that $n_{be}$ of the received symbols are not decoded unanimously) can be found as $$P(M_{HEC} = 18 - n_{be} | n_{se}) = \sum_{j=0}^{n_{be}} \binom{18-n_{se}}{j} p_1^j (1-p_1)^{18-n_{se}-j} \times \binom{n_{se}}{n_{be}-j} p_2^{n_{be}-j} (1-p_2)^{n_{se}-n_{be}-j}. \quad (7)$$

The above expression follows from the fact that of the $n_{be}$ symbols that are not decoded unanimously, j have to be correct and, consequently, $n_{be}-j$ must be erroneously decoded. By summing over all possible ways that the $n_{be}$ symbols can occur weighted by the respective probability, one derives the above expression. Clearly, then, given that $n_{se}$ symbols are erroneously decoded, the probability that at most $n_{be}$ symbols will be unanimously decoded is simply given by the following sum, $$P(M_{HEC} \geq 18 - n_{be} | n_{se}) = \sum_{n_{be}^1 = 0}^{n_{be}} P(M_{HEC} = 18 - n_{be} | n_{se}). \quad (8)$$

Referring back, then to Eq. (4), the probability of accepting an incorrect header can now be expressed as a function of the threshold $HEC_T$ as follows:

$$P_{ud}(HEC_T) = \sum_{j=1}^{18} S(j+1) P_s^j (1-P_s)^{(18-j)} P(M_{HEC} \geq HEC_T | j). \quad (9)$$

Figure 2:
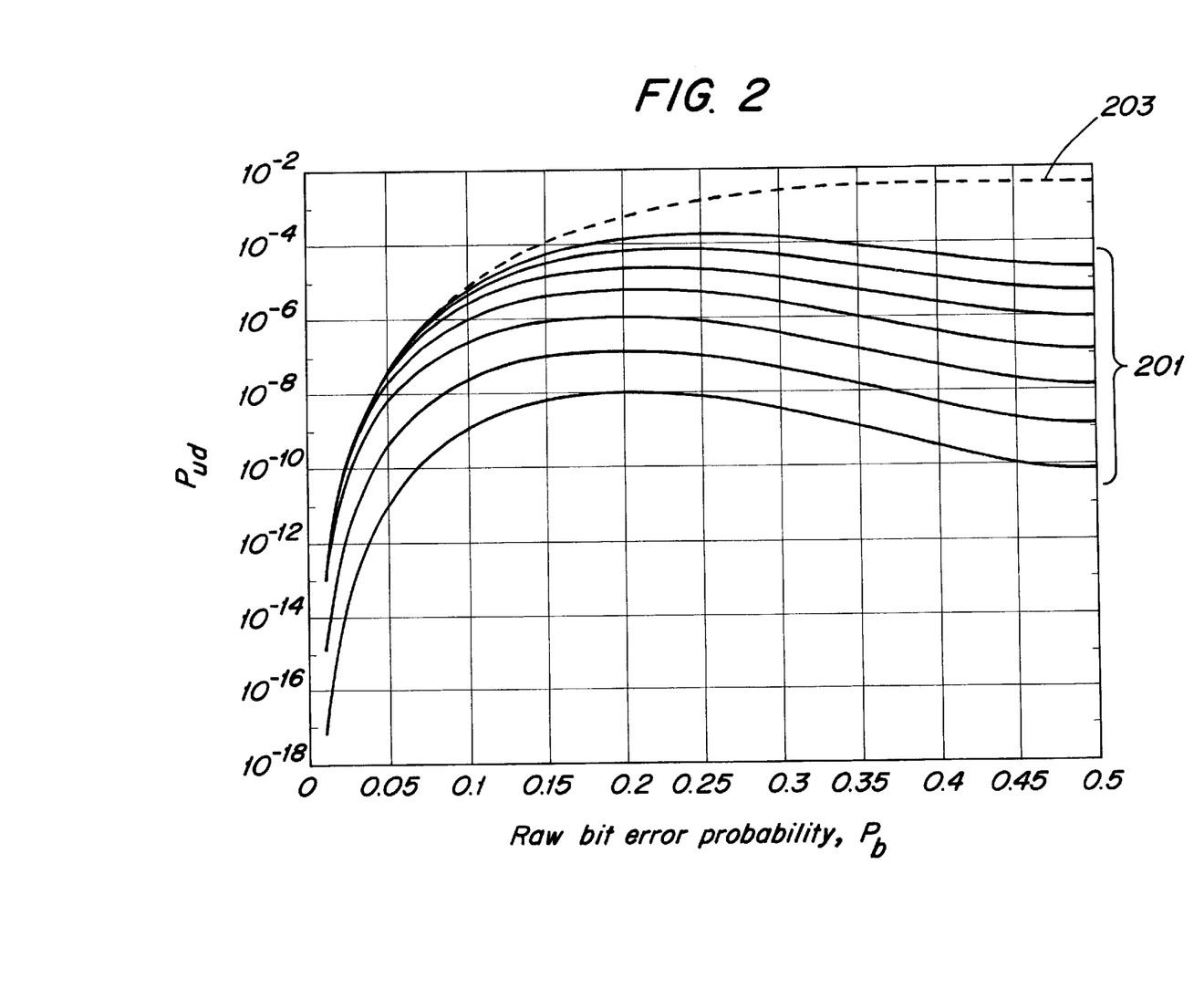
FIG. 2 is a graph depicting, for different values of $HEC_T$, the probability of accepting an incorrect packet header, $P_{ud}$, plotted as a function of the raw bit error probability, $P_b$.

FIG. 2 is a graph depicting, for different values of $HEC_T$, the probability of accepting an incorrect packet header $P_{ud}$, plotted as a function of the raw bit error probability, $P_b$. From top to bottom, the seven solid-line graphs 201 are respective plots for $HEC_T=10, 11, 12, 13, 14, 15$, and 16. For comparison, a dashed-line graph 203 for the case in which $HEC_T=0$ (i.e., the performance for the case in which acceptance of the decoded bits is based only on the error detection check (e.g., CRC)) is also shown. It can be seen from the graphs that the invention (i.e., $HEC_T \neq 0$) substantially improves performance.

The reason why $P_{ud}(HEC_T)$ is not monotonically increasing can be explained by the fact that, as the channel gets very noisy, the probability of having many unanimous decoding decisions decreases; that is, the extra requirement of $M_{HEC} \geq HEC_T$ will not be met. Also, when the channel is relatively good, almost all accepted incorrect headers have exactly four errors, and the number of unanimous decoding decisions then with a high probability corresponds to just these four erroneous symbols. This effectively means that for values of $HEC_T \leq 14$, Eqs.(9) and (4) will give the same result. Referring to FIG. 2, it is seen that for $HEC_T > 14$, the probability of accepting an incorrect header is also substantially reduced for small values of the raw bit error rate. The simple explanation for this is that in order to make four symbol errors, which is the smallest number required for the CRC to still check out all right, without more than, say, three symbols not decoded unanimously, at least one of the symbols must be unanimously decoded incorrect.

The trade-off when deciding on the value for $HEC_T$ is of course that too large a value for $HEC_T$ will increase the number of correct packet headers that are rejected too much, whereas a value for $HEC_T$ that is too small will insufficiently reduce the probability of accepting incorrect headers. Defining the throughput for the header, $\eta$, as the probability of accepting a correct header, it follows that without the extra constraint concerning unanimously decoded decisions, we have $$\eta = 1 - P_{cw} = (1-P_s)^{18}, \quad (10)$$

where $P_s$ is found according to Eq. (3), and $P_{cw}$ is the probability of a codeword error. (In this exemplary embodiment, the "codeword" we are interested in is just the header, so $P_{cw}$ represents the probability of experiencing a header error). Adding the extra constraint is simple since we just let $n_{se}=0$ in Eqs. (7) and (8). Doing this we obtain $$\eta = (1-P_s)^{18} P(M_{HEC} \geq HEC_T | 0). \quad (11)$$

Figure 3:
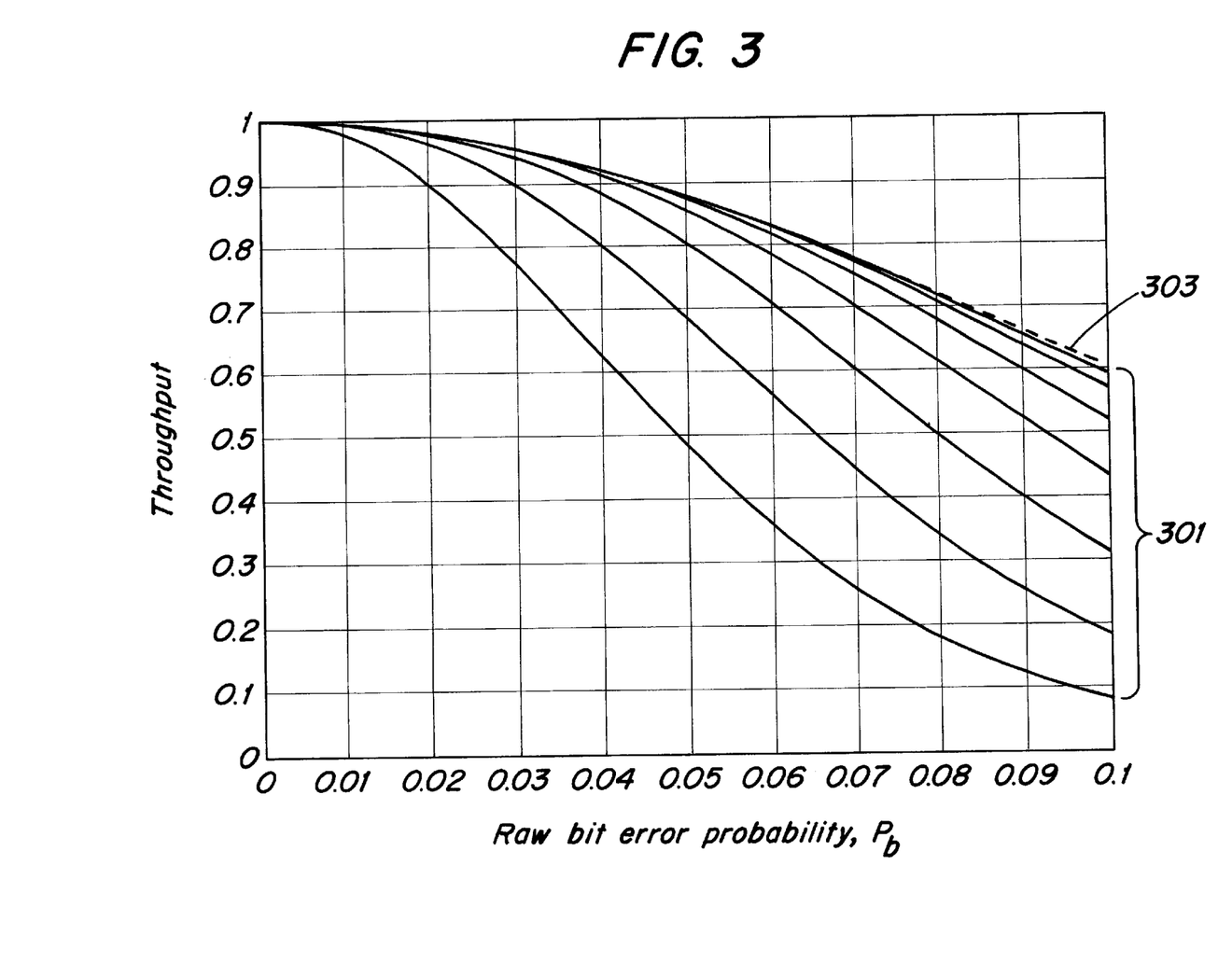
FIG. 3 is a graph of the throughput, for each of several quality threshold values, plotted as a function of $P_b$.

FIG. 3 is a graph of the throughput plotted as a function of $P_b$. From top to bottom, the seven solid-line graphs 301 are respective plots for $HEC_T=10, 11, 12, 13, 14, 15,$ and $16$. For comparison, a dashed-line graph 303 for the case in which $HEC_T=0$ (i.e., the performance for the case in which acceptance of the decoded bits is based only on the error detection check (e.g., CRC)) is also shown. As can be seen, for $P_b<5\%$ the reduction in throughput for $HEC_T<14$ is negligible. For $P_b<2\%$, choosing $HEC_T$ as large as 15 might even be considered as acceptable from a throughput point of view.

Having described an exemplary embodiment of the invention, a more general case will now be described. Here, the (3,1) repetition code of the above-described exemplary embodiment is replaced by an arbitrary FEC code. The quality measure from this FEC code can then either be the number of errors corrected, or it can be another parameter describing the reliability of the received sequence. Using the number of corrected errors as the quality measure is only possible if hard decision decoding is employed by the FEC code, that is, if the received sequence is first quantized into bits, which are then used by the FEC code in the decoding process. Formally, if $r=r_1, r_2, \ldots, r_N$ is the received (and quantized) sequence, and $v=v_1, v_2, \ldots, v_N$ is the corresponding sequence after decoding, the number of errors in the received sequence is just the Hamming weight of the error sequence, i.e., $$W_H = \sum_{n=1}^{N} r_n \oplus v_n, \quad (12)$$

where $\oplus$ denotes a logical exclusive-OR operation, that is, $r_n \oplus v_n = 1$ if and only if $r_n$ and $v_n$ are not identical. To determine whether the received sequence is sufficiently reliable, $W_H$ is compared with $FEC_C$, and the received sequence is rejected if $W_H > FEC_C$.

If the input sequence is not quantized into bits, or symbols, but rather consists of real numbers, (so-called "soft decisions") a very similar approach can still be taken. In this case, the received sequence is compared to a hypothesized received sequence (i.e., the noiseless soft decision values) that is generated from the actual decoded sequence. In this case, the hypothesized received sequence represents a noiseless received sequence if the actual decoded sequence is correct. If the received sequence and the noiseless sequence differ substantially, this means that the received sequence is very noisy and this information can be used to reject the packet for the same reason as a packet can be rejected if the number of corrected bits in the case of hard decision exceeds $FEC_C$. The way to judge if a received sequence is noisy or not depends on what the noise looks like. Probably the most commonly used measure is based on the Euclidean distance. Again, let $r=r_1, r_2, \ldots, r_N$ be the received sequence, and let $v=v_1, \ldots, v_2, v_N$ be the corresponding noiseless sequence, as described above. The squared Euclidean distance is then calculated as $$W_{Euc} = \sum_{n=1}^{N} (r_n - v_n)^2. \quad (13)$$

If $r=v+n$ (i.e., the noise is additive), where $n=n_1, n_2, \ldots, n_N$ is the noise sequence, it follows that $$W_{Euc} = \sum_{n=1}^{N} n_n^2, \quad (14)$$

that is, the squared Euclidean distance will be an adequate measure of the noise energy. Referring to Eq. (14), a large value for $W_{Euc}$ means that the noise is large, thereby having the same meaning as $W_H$ in Eq. (12). Therefore, the same approach can also be taken in embodiments that utilize soft decision values (i.e., i.e., the packet is rejected if $W_{Euc}$ exceeds some predetermined threshold).

To summarize, in a system where the data is coded for both error correction and error detection, and where a complete data segment consists of one or several codewords whose validity is checked by a CRC or other error detecting code, (that is, the CRC is used to determine whether all codewords are correct or not), the invention presents a simple means to trade error correction and error detection. This allows a simple way to utilize the overall coding in an optimal way. In particular, if a system is originally designed to operate under conditions in which the error correcting code is very useful, so that error correction will be the key issue for performance, but then is used in an interference limited environment such as the ISM-band, the invention provides a simple means of tuning the overall coding procedure in order to improve the error detecting capability of the system with very minor modifications in a receiver design.

Figure 4:
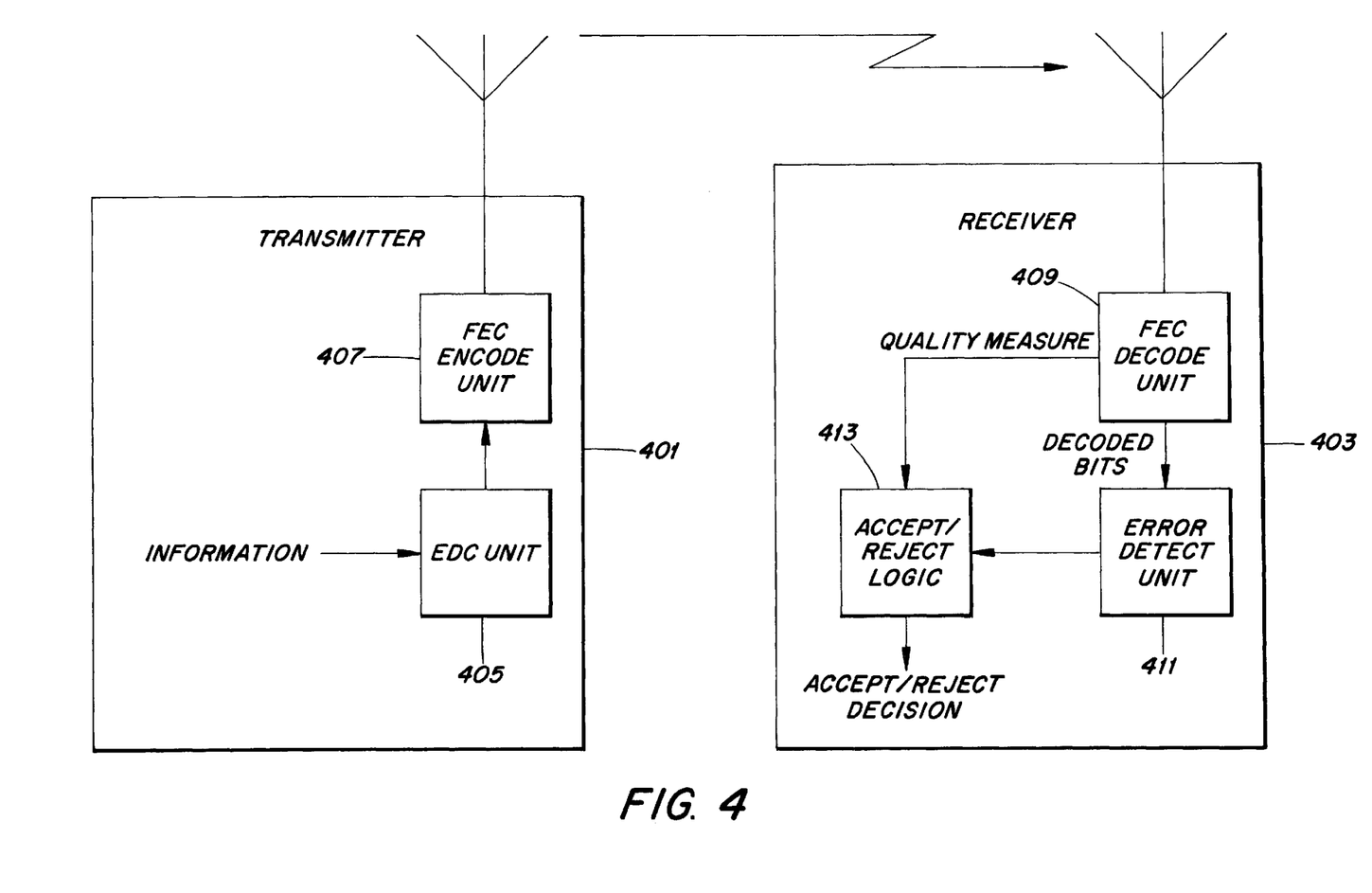
FIG. 4 is a block diagram showing a transmitter and a receiver that communicate with one another in a communication system, such as a radio communication system, and that operate in accordance with the invention.
Figure 5:
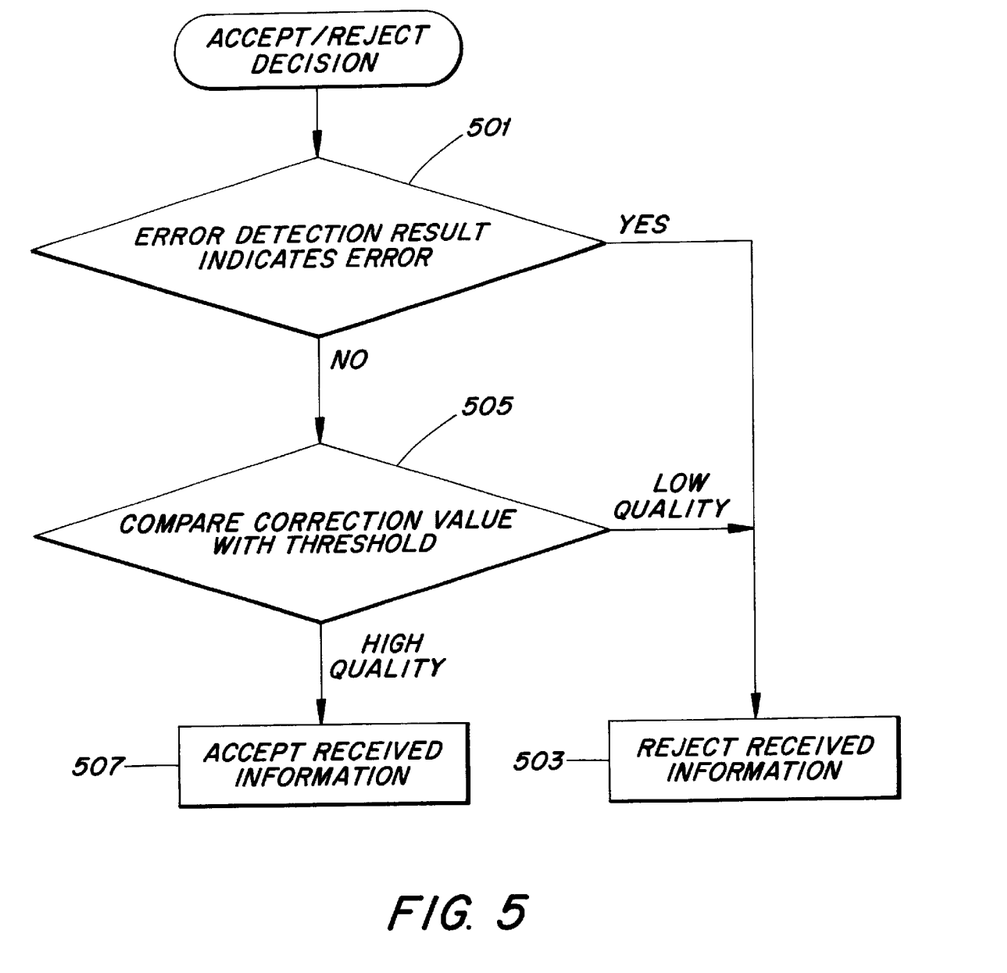
FIG. 5 is a flow chart depicting an exemplary embodiment of the high level operation of the accept/reject logic in accordance with an aspect of the invention.

The invention will now be further described with reference to FIGS. 4 and 5. Referring first to FIG. 4, this is a block diagram showing a transmitter 401 and a receiver 403 that communicate with one another in a communication system, such as a radio communication system, and that operate in accordance with the invention. Within the transmitter 401, information to be transmitted is first supplied to an Error Detection Coding (EDC) unit 405. In an exemplary embodiment, the EDC unit 405 generates a CRC code from the supplied information, and appends the generated CRC code to the information. Other types of Error Detection Coding could be applied in alternative embodiments. The EDC-coded information is then supplied to a Forward Error Correction (FEC) coding unit 407. In the exemplary embodiment, the FEC coding is a (3,1) repetition code, which takes each one of the EDC-coded information bits, and replicates it so that three bits are generated at the output for every one bit supplied to the input. Other types of FEC coding may be used in alternative embodiments. The FEC-coded information is then transmitted to the receiver 403. Components within the transmitter for transmitting the FEC-coded information are well known, and are omitted from the figure as well as the discussion in order to facilitate an understanding of the invention. For the same reason, components within the receiver for receiving the FEC-coded information are also omitted from this discussion as well as from FIG. 4.

After the FEC-coded information is received within the receiver 403, it is supplied to an FEC decoding unit 409, which performs error correction decoding to generate decoded bits. The decoded bits, which include bits corresponding to the error detection code appended at the transmitter, are then supplied to an error detection unit 411, which generates an output representing whether an error has been detected.

The FEC decoding unit 409 further generates an correction value output representing a quality measurement of the received FEC-coded information. As explained above, this quality measure can take a number of alternative forms. In some embodiments, it may represent how much correction was performed by the FEC decoding unit 409 in order to generate the decoded bits. For example, the correction value may indicate the number of decoded bits that were generated by unanimous decisions made within the FEC decoding unit 409 (i.e., the quality measure may be $M_{HEC}$).

The correction value (quality measure) from the FEC decoding unit 409 as well as the error detection output from the error detection unit 411 are supplied to logic that generates an accept/reject decision 413 (henceforth, "accept/reject logic 413"). The accept/reject logic 413 uses the inventive principles described in detail above to generate a signal that is indicative of whether the received FEC-coded information should be accepted or rejected.

The high level operation of the accept/reject logic 413 will now be described with reference to the flow chart of FIG. 5. The error detection result (generated by the error detection unit 411) is analyzed to determine whether an error was detected (decision block 501). If an error was detected ("YES" path out of decision block 501), then the received information will be rejected (step 503). The correction value (generated by the FEC decoding unit 409) is also evaluated ("NO" path out of decision block 501). In particular, the correction value is compared with a threshold value (decision block 505). If the comparison indicates that the received FEC-coded information was of too low a quality (e.g., if too few decoded bits were generated by unanimous decision within the decoding process) ("LOW QUALITY" path out of decision block 505), then the received information will be rejected (step 503). Otherwise ("HIGH QUALITY" path out of decision block 505), the received information will be accepted (step 507). It is noted that the flow chart of FIG. 5 illustrates just one of many possible embodiments of the operation of the accept/reject logic 413. For example, the order in which the illustrated steps are performed is not essential to the invention. Alternative orderings, and even simultaneous processing of the steps could alternatively be used.

The invention assumes that the errors due to an interferer occur in a random fashion. If this is not the case, such as when all the received bits are erroneously turned into zeros, the invention will not work. If this is the case something has to be done in addition to the inventive techniques described above, and this something should be done before the hard decisions take place (e.g., in the radio).

The invention has been described with reference to a particular embodiment. However, it will be readily apparent to those skilled in the art that it is possible to embody the invention in specific forms other than those of the preferred embodiment described above. This may be done without departing from the spirit of the invention.

For example, exemplary embodiments have used parameters specific to BLUETOOTH™-compliant systems. However, it will be readily apparent that the various aspects of the invention, which involve alternatively accepting or rejecting the decoded information signals as a function of both the error detection result and a comparison of a correction value (which is representative of how much correction was performed by the error correction decoding technique to generate the decoded signals)with a threshold value may be applied to control the acceptance or rejection of decoded bits in any type of communication system that employs error detection and error correcting coding.

Thus, the preferred embodiment is merely illustrative and should not be considered restrictive in any way. The scope of the invention is given by the appended claims, rather than the preceding description, and all variations and equivalents which fall within the range of the claims are intended to be embraced therein.

What is claimed is:

1. A method of receiving an encoded signal that comprises a plurality of received encoded signal values, the method comprising:

using an error correction decoding technique to generate a plurality of decoded signals from the encoded signal, wherein the plurality of decoded signals comprises one or more decoded information signals and one or more decoded error detection signals;

generating a correction value that is representative of how much correction was performed by the error correction decoding technique to generate the plurality of decoded signals;

using the one or more decoded error detection signals to generate an error detection result; and alternatively accepting or rejecting the decoded information signals as a function of the error detection result and a comparison of the correction value with a threshold value.

2. The method of claim 1, wherein:

the received encoded signal values are binary values; and the correction value is a Hamming weight, $W_H$, that is generated as a function of the received encoded signal values and a corresponding plurality of comparison encoded signal values generated from the plurality of decoded signals.

3. The method of claim 2, wherein alternatively accepting or rejecting the decoded information signals as a function of the error detection result and the comparison of the correction value with a threshold value comprises:

rejecting the decoded information signals if the error detection result indicates that the plurality of decoded signals includes an error or if the Hamming weight, $W_H$, is greater than the threshold value; and otherwise accepting the decoded information signals.

4. The method of claim 1, wherein:

the received encoded signal values are soft decision values; and the correction value is an estimate of a noise energy in the received encoded signal values.

5. The method of claim 4, wherein the estimate of the noise energy is a squared Euclidean distance $W_{Euc}$, that is generated as a function of the received encoded signal values and a corresponding plurality of comparison encoded signal values generated from the plurality of decoded signals.

6. The method of claim 1, wherein the one or more decoded error detection signals comprise one or more cyclic redundancy check bits.

7. The method of claim 1, wherein:

the received encoded signal values are binary values; and the correction value is a value, $M_{HEC}$, that represents how many of the plurality of decoded signals were generated without any correction being performed by the error correction decoding technique.

8. The method of claim 7, wherein alternatively accepting or rejecting the decoded information signals as a function of the error detection result and the comparison of the correction value with a threshold value comprises:

rejecting the decoded information signals if the error detection result indicates that the plurality of decoded signals includes an error or if the correction value, $M_{HEC}$, is less than the threshold value; and otherwise accepting the decoded information signals.

9. An apparatus for receiving an encoded signal that comprises a plurality of received encoded signal values, the apparatus comprising:

logic that uses an error correction decoding technique to generate a plurality of decoded signals from the encoded signal, wherein the plurality of decoded signals comprises one or more decoded information signals and one or more decoded error detection signals;

logic that generates a correction value that is representative of how much correction was performed by the error correction decoding technique to generate the plurality of decoded signals;

logic that uses the one or more decoded error detection signals to generate an error detection result; and logic that alternatively accepts or rejects the decoded information signals as a function of the error detection result and a comparison of the correction value with a threshold value.

10. The apparatus of claim 9, wherein:

the received encoded signal values are binary values; and the correction value is a Hamming weight, $W_H$, that is generated as a function of the received encoded signal values and a corresponding plurality of comparison encoded signal values generated from the plurality of decoded signals.

11. The apparatus of claim 10, wherein the logic that alternatively accepts or rejects the decoded information signals as a function of the error detection result and the comparison of the correction value with the threshold value comprises:

logic that rejects the decoded information signals if the error detection result indicates that the plurality of decoded signals includes an error or if the Hamming weight, $W_H$, is greater than the threshold value; and that otherwise accepts the decoded information signals.

12. The apparatus of claim 9, wherein:

the received encoded signal values are soft decision values; and the correction value is an estimate of a noise energy in the received encoded signal values.

13. The apparatus of claim 12, wherein the estimate of the noise energy is a squared Euclidean distance $W_{Euc}$, that is generated as a function of the received encoded signal values and a corresponding plurality of comparison encoded signal values generated from the plurality of decoded signals.

14. The apparatus of claim 9, wherein the one or more decoded error detection signals comprise one or more cyclic redundancy check bits.

15. The apparatus of claim 9, wherein:

the received encoded signal values are binary values; and the correction value is a value, $M_{HEC}$, that represents how many of the plurality of decoded signals were generated without any correction being performed by the error correction decoding technique.

16. The apparatus of claim 15, wherein the logic that alternatively accepts or rejects the decoded information signals as a function of the error detection result and the comparison of the correction value with the threshold value comprises:

logic that rejects the decoded information signals if the error detection result indicates that the plurality of decoded signals includes an error or if the correction value, $M_{HEC}$, is less than the threshold value; and that otherwise accepts the decoded information signals.

* * * * *

UNITED STATES PATENT AND TRADEMARK OFFICE
CERTIFICATE OF CORRECTION

PATENT NO. : 6,606,726 B1
DATED : August 12, 2003
INVENTOR(S) : Leif Wilhelmsson et al.

It is certified that error appears in the above-identified patent and that said Letters Patent is hereby corrected as shown below:

<u>Column 7,</u>
Equation 5, please replace as follows:

$$p_1 = \frac{3P_b(1-P_b)^2}{(1-P_b)^3 + 3P_b(1-P_b)^2}$$

Signed and Sealed this

Thirtieth Day of March, 2004

JON W. DUDAS
*Acting Director of the United States Patent and Trademark Office*